US00RE49633E

(19) United States
(12) Reissued Patent
Zhang et al.

(10) Patent Number: US RE49,633 E
(45) Date of Reissued Patent: Aug. 29, 2023

(54) ADAPTIVE MODULATION SCHEME OF MOSFET DRIVER KEY PARAMETERS FOR IMPROVED VOLTAGE REGULATOR EFFICIENCY AND SYSTEM RELIABILITY

(71) Applicant: Dell Products L.P., Round Rock, TX (US)

(72) Inventors: Kejiu Zhang, Los Gatos, CA (US); Shiguo Luo, Austin, TX (US); Ralph H. Johnson, Round Rock, TX (US)

(73) Assignee: Dell Products L.P., Round Rock, TX (US)

(21) Appl. No.: 17/395,662

(22) Filed: Aug. 6, 2021

Related U.S. Patent Documents

Reissue of:
(64) Patent No.: 10,594,313
Issued: Mar. 17, 2020
Appl. No.: 15/491,561
Filed: Apr. 19, 2017

(51) Int. Cl.
*H03K 17/16* (2006.01)
*H03K 17/082* (2006.01)
*H02M 1/38* (2007.01)
*H02M 1/08* (2006.01)

(52) U.S. Cl.
CPC ..... *H03K 17/082* (2013.01); *H02M 1/08* (2013.01); *H02M 1/385* (2021.05)

(58) Field of Classification Search
CPC .... H03K 17/16; H03K 17/165; H03K 17/082; H03K 2217/0063; H02M 1/08; H02M 1/38; H02M 2001/385
USPC ..... 323/271
See application file for complete search history.

(56) References Cited

U.S. PATENT DOCUMENTS

| | | | | |
|---|---|---|---|---|
| 9,143,079 | B2 * | 9/2015 | Kakimoto | H02P 27/06 |
| 9,240,722 | B2 | 1/2016 | Luo et al. | |
| 9,343,949 | B2 * | 5/2016 | Agarwal | H02M 3/1588 |
| 9,443,431 | B1 * | 9/2016 | Laird | G08G 1/20 |
| 9,678,555 | B2 | 6/2017 | Luo et al. | |
| 10,135,430 | B2 * | 11/2018 | Chen | H03K 17/04123 |
| 2006/0250183 | A1 * | 11/2006 | Zhao | H03F 1/0277 330/251 |
| 2008/0278123 | A1 * | 11/2008 | Mehas | H02M 3/1588 323/266 |
| 2012/0206121 | A1 * | 8/2012 | Evans | H02M 3/156 323/288 |
| 2015/0091539 | A1 * | 4/2015 | Norling | H02M 3/158 323/271 |

* cited by examiner

*Primary Examiner* — My Trang Ton
(74) *Attorney, Agent, or Firm* — Joseph Mencher

(57) ABSTRACT

Systems and methods for adaptive modulation of MOSFET driver key parameters for improved voltage regulator efficiency and reliability in a voltage regulator may include a power stage. The power stage may include a high side switch including a high side gate, a peak voltage detection circuit, and a high side driver strength modulator circuit. The high side driver strength modulator circuit may determine a high side driver strength level. The high side driver strength modulator circuit may also connect a subset of the set of high side gate drivers to the high side gate based on the high side driver strength level. The high side driver strength modulator circuit may also disconnect a remaining subset of the set of high side gate drivers from the high side gate.

12 Claims, 5 Drawing Sheets

ADAPTIVE MODULATION SCHEME OF MOSFET DRIVER KEY PARAMETERS FOR IMPROVED VOLTAGE REGULATOR EFFICIENCY AND SYSTEM RELIABILITY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This is a reissue of U.S. Pat. No. 10,594,313, which issued from application Ser. No. 15/491,561 filed Apr. 19, 2017, the disclosure of which is hereby incorporated by reference in its entirety.*

BACKGROUND

Field of the Disclosure

This disclosure relates generally to information handling systems and, more particularly, to a multi-phase voltage regulator for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may include a variety of hardware and/or software components that may be configured to process, store, and/or communicate information. Information handling systems may also include one or more multi-phase voltage regulators to ensure that necessary electrical power is consistently supplied to one or more devices in the information handling system. Typical multi-phase voltage regulators may include a voltage regulator controller and multiple power stages, each power stage may include a power metal-oxide-semiconductor-field-effect-transistor (MOSFET) switch having a high side MOSFET switch and a low side MOSFET switch and high frequency MOSFET gate drivers for switching the high side and low side MOSFET switches ON and OFF. These power MOSFET switches, however, may produce large voltage spikes at the load which are caused by high frequency output current di/dt during MOSFET switching events. To mitigate the impact of these voltage spikes and enable faster switching, traditional power MOSFET switch designs may use high frequency MOSFET gate drivers with fixed driving capabilities at worst case load range of the power MOSFET switch. Nevertheless, the efficiency of both the multi-phase voltage regulator and the system may be limited for the remaining load ranges of the power MOSFET switch, which may be the majority of the loading conditions.

SUMMARY

In one aspect, a disclosed voltage regulator may include a power stage. The power stage may include a high side switch including a high side gate, a peak voltage detection circuit coupled to the high side switch to provide a voltage stress level based on a high side output voltage of the high side switch, and a high side driver strength modulator circuit coupled to the peak voltage detection circuit. The high side driver strength modulator circuit may be configured to determine a high side driver strength level for a set of high side gate drivers based on one or more of a load current level of the power stage and the voltage stress level. The high side driver strength modulator circuit may also be configured to connect a subset of the set of high side gate drivers to the high side gate based on the high side driver strength level. The high side driver strength modulator circuit may further be configured to disconnect a remaining subset of the set of high side gate drivers from the high side gate.

In any of the disclosed embodiments of the voltage regulator, the power stage may also include a low side switch including a low side gate and a low side driver strength modulator circuit coupled to the peak voltage detection circuit. The low side driver strength modulator circuit may be configured to determine a low side driver strength level for a set of low side gate drivers based on one or more of the load current level of the power stage and the voltage stress level. The low side driver strength modulator circuit may also be configured to connect a subset of the set of low side gate drivers to the low side gate based on the low side driver strength level. The low side driver strength modulator circuit may further be configured to disconnect a remaining subset of the set of low side gate drivers from the low side gate.

In any of the disclosed embodiments of the voltage regulator, the high side driver strength modulator circuit may also include a source impedance modulator circuit and a set of high side driver switches, each coupled between a corresponding high side gate driver of the set of high side gate drivers and the high side gate. The connection of the subset of the set of high side gate drivers to the high side gate may further include the source impedance modulator circuit configured to close a subset of the set of high side driver switches to connect the subset of the set of high side gate drivers to the high side gate. The low side driver strength modulator circuit may also include a sink impedance modulator circuit and a set of low side driver switches, each coupled between a corresponding low side gate driver of the set of low side gate drivers and the low side gate. The connection of the subset of the set of low side gate drivers to the low side gate may further include the sink impedance modulator circuit configured to close a subset of the set of low side driver switches to connect the subset of the set of low side gate drivers to the low side gate.

In any of the disclosed embodiments of the voltage regulator, the power stage may also include a driver voltage optimizer circuit that may be configured to adjust a driver voltage level for the set of high side gate drivers and the set of low side gate drivers based on the load current level of the power stage.

In any of the disclosed embodiments of the voltage regulator, the driver voltage optimizer circuit that may be configured to adjust the driver voltage level, may also include the driver voltage optimizer circuit configured to reduce the driver voltage level when the driver voltage optimizer circuit determines that the load current level is less than or equal to a light load current threshold level and increase the driver voltage level when the driver voltage optimizer circuit determines that the load current level is greater than a heavy load condition threshold level.

In any of the disclosed embodiments of the voltage regulator, higher positive load current levels may correlate to higher driver voltage levels and lower positive load current levels may correlate to lower driver voltage levels. Higher magnitude negative load current levels may correlate to higher driver voltage levels and lower magnitude negative load current levels may correlate to lower driver voltage values.

In any of the disclosed embodiments of the voltage regulator, the power stage may also include a dead-time management circuit that may be configured to, when the dead-time management circuit determines that a current temperature of the power stage is less than or equal to a low temperature region threshold, adjust a programmable portion of a dead-time duration for the set of high side gate drivers and the set of low side gate drivers to a low temperature duration value.

In any of the disclosed embodiments of the voltage regulator, the dead-time management circuit may also be configured to, when the dead-time management circuit determines that the current temperature of the power stage is greater than or equal to a high temperature region threshold, adjust the programmable portion of the dead-time duration for the set of high side gate drivers and the set of low side gate drivers to a high temperature duration value.

In any of the disclosed embodiments of the voltage regulator, the dead-time duration may include the programmable portion of the dead-time duration and a dynamic portion of the dead-time duration proportional to a change in temperature of the power stage when the power stage may be in an operating temperature region.

In any of the disclosed embodiments of the voltage regulator, each of the high side switch and the low side switch may be a metal-oxide-semiconductor-field-effect-transistors (MOSFETs).

In another aspect, a disclosed method may include, providing, by a peak voltage detection circuit of a power stage of a voltage regulator, a voltage stress level based on a high side output voltage of a high side switch of the power stage. The method may also include determining, by a high side driver strength modulator circuit of the power stage, a high side driver strength level for a set of high side gate drivers of the power stage based on one or more of a load current level of the power stage and the voltage stress level. The method may further include connecting a subset of the set of high side gate drivers to a high side gate of the high side switch based on the high side driver strength level. The method may also include disconnecting a remaining subset of the set of high side gate drivers from the high side gate.

In any of the disclosed embodiments of the method, the method may include determining, by a low side driver strength modulator circuit of the power stage, a low side driver strength level for a set of low side gate drivers of the power stage based on one or more of the load current level of the power stage and the voltage stress level. The method may also include connecting a subset of the set of low side gate drivers to a low side gate of a low side switch based on the low side driver strength level. The method may further include disconnecting a remaining subset of the set of low side gate drivers from the low side gate.

In any of the disclosed embodiments of the method, connecting the subset of the set of high side gate drivers to the high side gate may further include closing, by a source impedance modulator circuit, a subset of a set of high side driver switches of the power stage to connect the subset of the set of high side gate drivers to the high side gate. Connecting the subset of the set of low side gate drivers to the low side gate may further include closing, by a sink impedance modulator circuit, a subset of a set of low side driver switches to connect the subset of the set of low side gate drivers to the low side gate.

In any of the disclosed embodiments of the method, the method may include adjusting, by a driver voltage optimizer circuit, a driver voltage level for the set of high side gate drivers and the set of low side gate drivers based on the load current level of the power stage.

In any of the disclosed embodiments of the method, the method may include adjusting the driver voltage level further including reducing the driver voltage level when the driver voltage optimizer circuit determines that the load current level is less than or equal to a light load current threshold level and increasing the driver voltage level when the driver voltage optimizer circuit determines that the load current level is greater than a heavy load condition threshold level.

In any of the disclosed embodiments of the method, higher positive load current levels may correlate to higher driver voltage levels and lower positive load current levels may correlate to lower driver voltage levels. Higher magnitude negative load current levels correlate to higher driver voltage levels and lower magnitude negative load current levels correlate to lower driver voltage values.

In any of the disclosed embodiments of the method, the method may include adjusting, by a dead-time management circuit, when the dead-time management circuit determines that a current temperature of the power stage is less than or equal to a low temperature region threshold, a programmable portion of a dead-time duration for the set of high side gate drivers and the set of low side gate drivers to a low temperature duration value.

In any of the disclosed embodiments of the method, the method may include adjusting, when the dead-time management circuit determines that the current temperature of the power stage is greater than or equal to a high temperature region threshold, the programmable portion of the dead-time duration for the set of high side gate drivers and the set of low side gate drivers to a high temperature duration value.

In any of the disclosed embodiments of the method, the dead-time duration may include the programmable portion of the dead-time duration and a dynamic portion of the dead-time duration proportional to a change in temperature of the power stage when the power stage may be in an operating temperature region.

In any of the disclosed embodiments of the method, each of the high side switch and the low side switch is a metal-oxide-semiconductor-field-effect-transistors (MOSFETs).

Other technical advantages will be apparent to those of ordinary skill in the art in view of the following specification, claims, and drawings.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
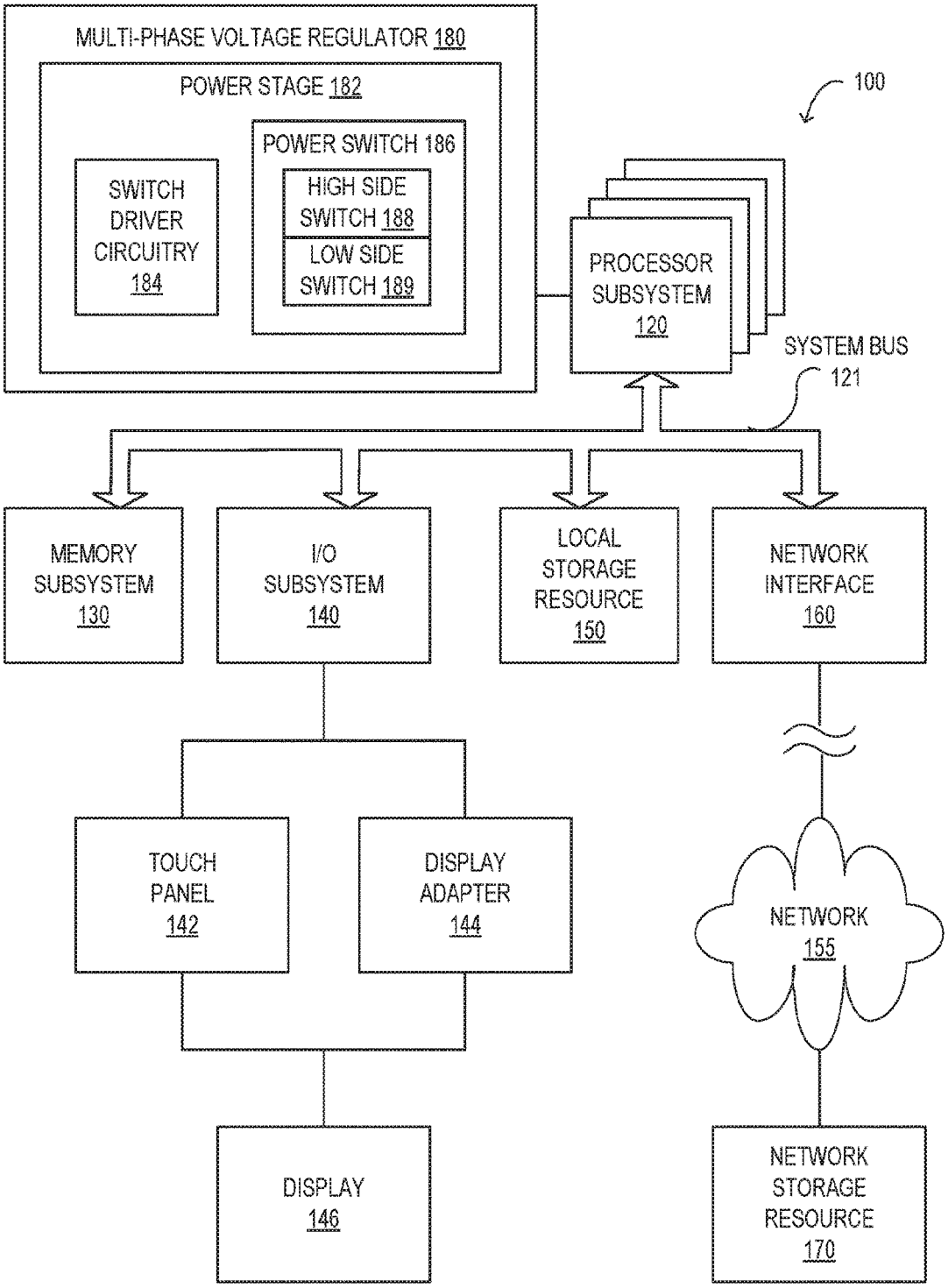
FIG. 1 is a block diagram of selected elements of an embodiment of an information handling system.

In the following description, details are set forth by way of example to facilitate discussion of the disclosed subject matter. It should be apparent to a person of ordinary skill in is the field, however, that the disclosed embodiments are exemplary and not exhaustive of all possible embodiments.

As used herein, a hyphenated form of a reference numeral refers to a specific instance of an element and the unhyphenated form of the reference numeral refers to the collective or generic element. Thus, for example, widget "72-1" refers to an instance of a widget class, which may be referred to collectively as widgets "72" and any one of which may be referred to generically as a widget "72".

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Current information handling systems may demand multi-phase voltage regulators having multiple power stages that are able to dynamically modulate switch driver parameters to reduce or eliminate voltage spikes across the entire load range of each individual power stage for the majority of loading conditions, while maximizing power efficiency and reliability and consistently supplying the necessary electrical current to the information handling systems. As will be described in further detail, the inventors of the present disclosure have developed novel circuits and methods disclosed herein for adaptive modulation of switch driver parameters for improved voltage regulator efficiency and reliability in a multi-phase voltage regulator.

Particular embodiments are best understood by reference to FIGS. 1, 2, 3, 4, 5, and 6 wherein like numbers are used to indicate like and corresponding parts.

Turning now to the drawings, FIG. 1 illustrates a block diagram depicting selected elements of an embodiment of information handling system 100. As shown in FIG. 1, components of information handling system 100 may include, but are not limited to, a multi-phase voltage regulator 180, which may comprise a plurality of power stages 182, driver circuitry 184, and a power switch 186 having a high side (HS) switch 188 and a low side (LS) switch 189, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. HS switch 188 and LS switch 189 may be field effect transistors (FETs), which may be metal-oxide semiconductor field-effect transistors (MOSFETs). System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to a network storage resource 170. Network 155 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, network storage resource 170 may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with a display 146 that is driven by display adapter 144.

As will be described in further detail, information handling system 100, or certain components included therein, may be supplied power by one or more power supply units. The power supply units may supply current to processor subsystem 120, memory subsystem 130, I/O subsystem 140, local storage resource 150, etc. A power supply unit may utilize a multi-phase voltage regulator to ensure the necessary electrical power is consistently supplied to these components. The multi-phase voltage regulator may include a voltage regulator controller and multiple power stages, each power stage may include a power metal-oxide-semiconductor-field-effect-transistor (MOSFET) switch arrangement having a high side MOSFET switch and a low side MOSFET switch and high frequency MOSFET gate drivers for switching the high side and low side MOSFET switches ON and OFF. As noted previously, current information handling systems continue to demand multi-phase voltage regulators that maximize energy efficiency, increased system performance, improved field-reliability, and reduced costs, while consistently supplying the necessary electrical current to the information handling systems. Advancements in Power MOSFET switch technology have enabled faster switching speeds and improvements in package and integration technology have reduced parasitic inductance, which has resulted in more efficient multi-phase voltage regulators. However, these power MOSFET switches may still exhibit large amplitude voltage spikes across the MOSFET drain-to-source ($V_{DS}$) of the high side power MOSFET switch and the low side power MOSFET switch caused by high frequency output current di/dt during switching the power MOSFET switch ON and OFF coupled with the parasitic inductance. These large amplitude voltage spikes can pollute the power plane, lower DDR RMT margins, and lead to MOSFET avalanche which may impact system robustness and lifetime reliability.

To mitigate the impact of these voltage spikes and enable faster switching, power MOSFET switch designs may use high frequency MOSFET gate drivers with fixed driving capabilities, a fixed MOSFET drive voltage, at a worst case load range of the power MOSFET switch, which may limit the amplitude of the voltage spikes to an acceptable level at the given worst case load. Nevertheless, the efficiency of both the multi-phase voltage regulator and the system may be limited for the remaining load ranges of the power MOSFET switch, which may be the majority of the loading conditions. The temperature of a power MOSFET switch may have an adverse effect on the switching dead-time, which has been observed to be as high as a thirty percent (30%) change in an integrated power stage. The change in switching dead-time may further impact the multi-phase voltage regulator's overall efficiency. Package impedance and parasitics may also affect the amplitude of the voltage spikes at the power MOSFET switch die. Due to the high current support per phase of the multi-phase voltage regulator, AC voltage on the power MOSFET switch die may surpass the breakdown voltage specification and may also lead to MOSFET avalanche.

Figure 2:
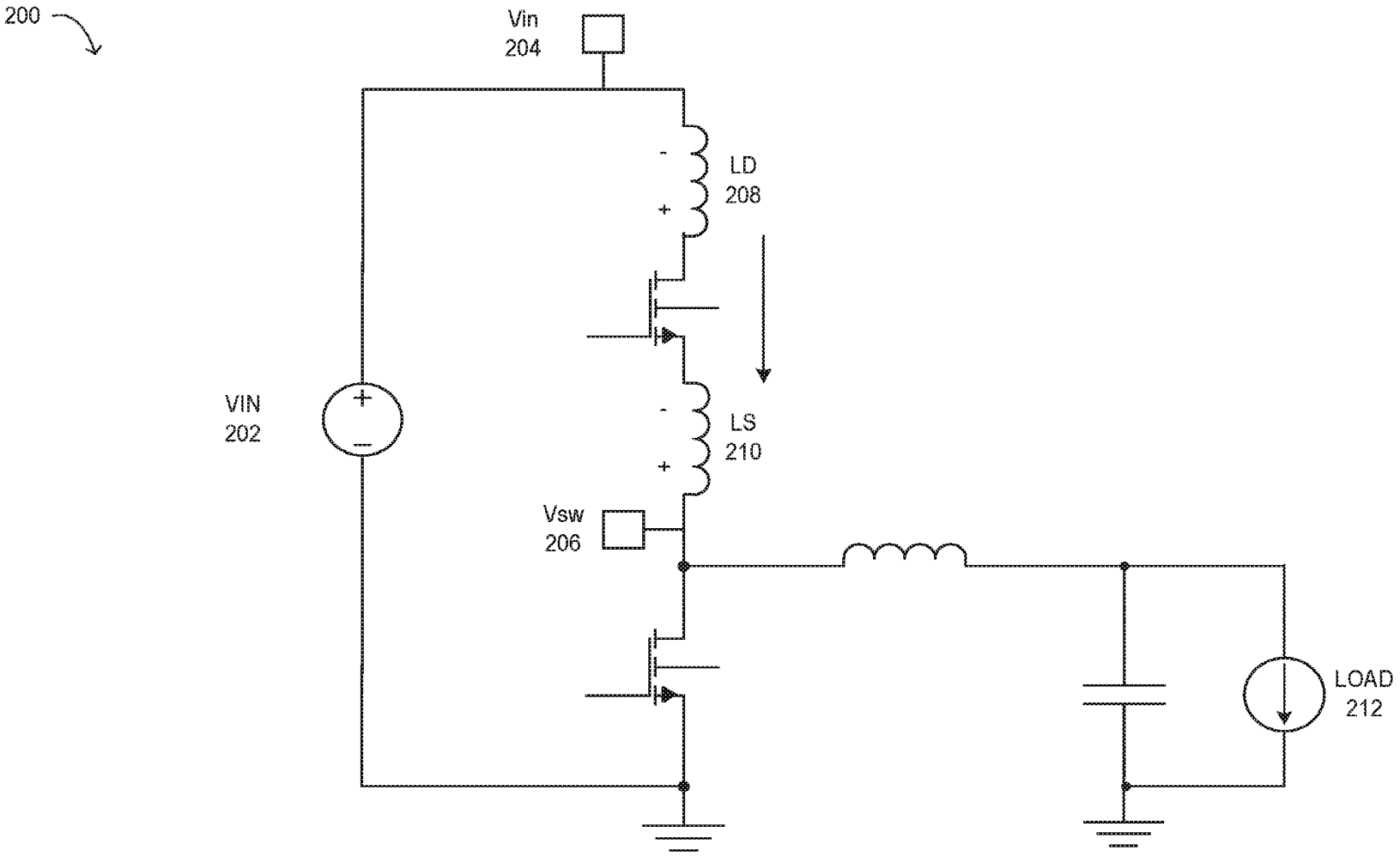
FIG. 2 is a diagram of selected elements of an embodiment of an equivalent circuit of high side parasitic inductance affecting high side drain-to-source voltage of a power switch of a multi-phase voltage regulator.

FIG. 2 depicts an equivalent circuit 200 of high side parasitic inductance affecting high side $V_{DS}$ of power switch 186 of multi-phase voltage regulator 180. Equivalent circuit 200 may include a voltage source VIN 202, an input voltage 204 Vin, a parasitic drain inductance ($L_D$) 208, a parasitic source inductance ($L_S$) 210, a voltage switching node ($V_{SW}$) of power switch 186, and a load 212. In different power stage packaging schemes, there may be a relatively larger drain inductance $L_D$ 208 or source inductance $L_S$ 210 which may be determined by the inductance loop of the interconnection between the switch driver circuitry 184 and the power MOSFET die for the integration of power switch 186 in power stage 182. The high side $V_{DS}$ spike during switching OFF the HS switch 188, the voltage generated across the parasitic inductance $L_D$ 208 and $L_S$ 210, and the polarities are shown in equivalent circuit 200.

Referring back to FIG. 1, a power supply unit may utilize multi-phase voltage regulator 180 to ensure the necessary electrical power is consistently supplied to information handling system 100 and to address the problems and issues described above. As shown, multi-phase voltage regulator 180 is connected to processor subsystem 120. In operation, each power stage 182 of the plurality of power stages 182 of multi-phase voltage regulator 180, together with switch driver circuitry 184, power switch 186, HS switch 188, and LS switch 189 of the power stage 182, may perform adaptive modulation of switch driver parameters independently from the other power stages 184, as described in further detail below. Performing adaptive modulation of the switch driver parameters may improve voltage regulator efficiency and reliability.

Figure 3:
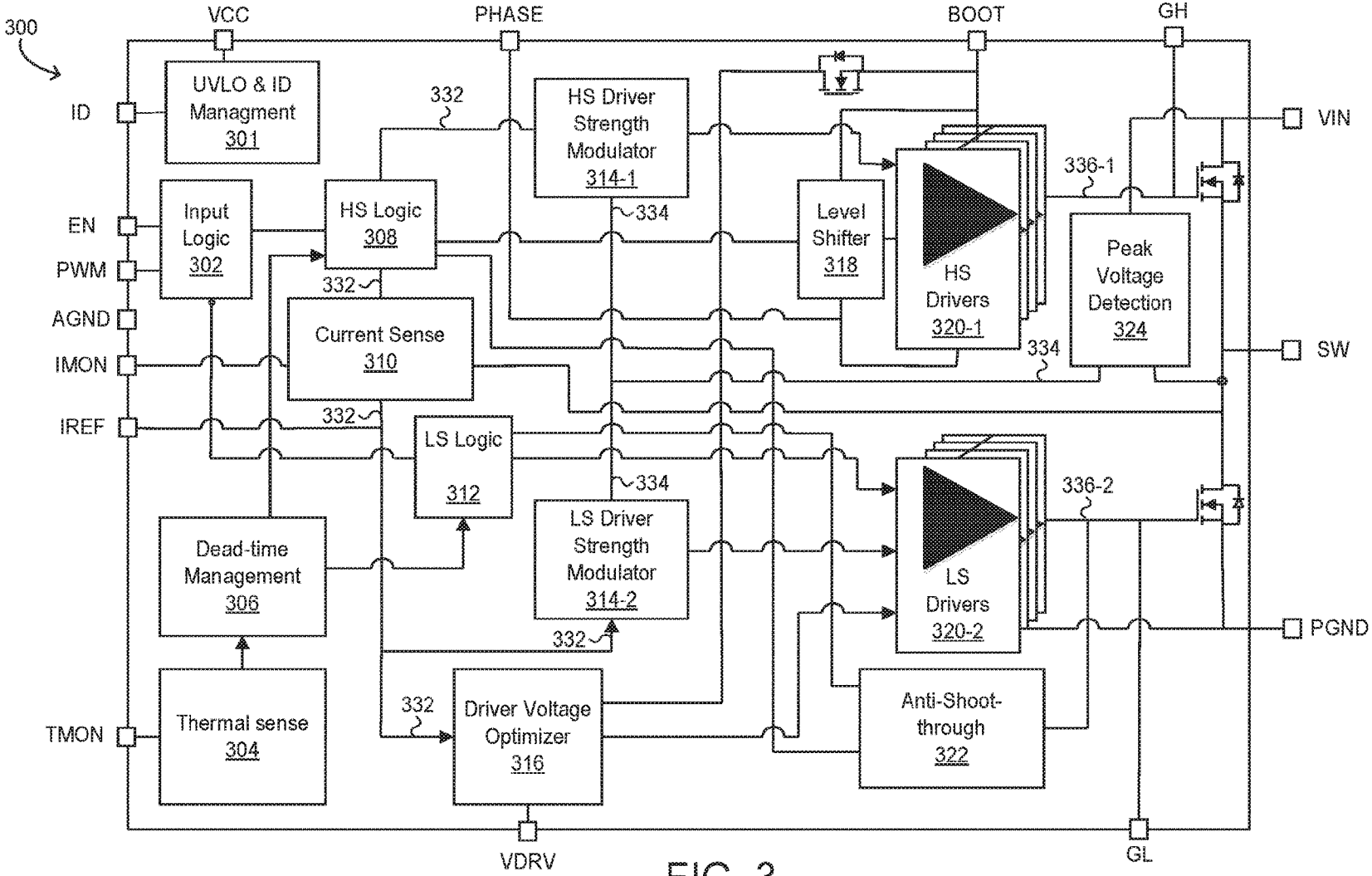
FIG. 3 is a diagram of selected elements of a multi-phase voltage regulator power stage with switch driver circuitry.

Referring now to FIG. 3, selected elements of an embodiment of a multi-phase voltage regulator 300 with switch driver circuitry 184 is demonstrated. FIG. 3 illustrates further internal details of switch driver circuitry 184. It is noted that FIG. 3 is not drawn to scale but is a schematic illustration. In various embodiments, switch driver circuitry 184 may be implemented using additional or fewer elements than illustrated in FIG. 3.

As shown in FIG. 3, switch driver circuitry 184 may include, but are not limited to, a under voltage lockout (UVLO) and identification (ID) management circuit 301, an input logic 302, a thermal sense circuit 304, a dead-time management circuit 306, a HS logic 308, a current sense circuit 310, a LS logic 312, driver strength modulator circuits 314 including a HS driver strength modulator circuit 314-1 and a LS driver strength modulator circuit 314-2, a driver voltage optimizer circuit 316, a level shifter 318, multiple sets of gate drivers 320 including a set of HS gate drivers 320-1 and a set of LS gate drivers 320-2, an anti-shoot-through circuit 322, and a peak voltage detection circuit 324.

In FIG. 3, thermal sense circuit 304 may be coupled to a temperature monitor (TMON) signal input and dead-time management circuit 306. Dead-time management circuit 306 may be coupled to the set of HS gate drivers 320-1, via HS logic 308 and level shifter 318, and the set of LS gate drivers 320-2, via LS logic 312. Current sense circuit 310 may be coupled to HS driver strength modulator circuit 314-1, via HS logic 308, LS driver strength modulator circuit 314-2, and driver voltage optimizer circuit 316. Current sense circuit 310 may also be coupled to a load current monitor (IMON) input of power stage 182 and an IMON voltage reference (IREF) input of power stage 182. HS driver strength modulator circuit 314-1 may also be coupled to peak voltage detection circuit 324 and the set of HS gate drivers 320-1. LS driver strength modulator circuit 314-2 may also be coupled to peak voltage detection circuit 324 and the set of LS gate drivers 320-2. Peak voltage detection circuit [328] *324* may also be coupled to a switching node output (SW) of power switch 186 of power stage 182. Driver voltage optimizer circuit 316 may also be coupled to the set of HS gate drivers 320-1 and the set of LS gate drivers 320-2.

During operation, switch driver circuitry 300 may use adaptive modulation of switch driver parameters to suppress excessive voltage spikes in major loading conditions of power switch 186 including: adjustment of the driver strength based on one or more of load current information or voltage stress level of power switch 186; modulation of the driver voltage based on the load conditions of power switch 186; and adjustment of dead-time duration based on temperature information of power stage 182.

During operation, current sense circuit 310 may monitor the load current at IMON input that flows through the MOSFET channels and IREF at IREF input of power stage 182 to provide load current information of power switch 186. Peak voltage detection circuit 324 may monitor a drain to source voltage (VDS) at SW of power stage 182 to provide a voltage stress level of power switch 186, which is based on a high side output voltage of high side switch 188. HS driver strength modulator circuit 314-1 may receive the load current information of power stage 182 from current sense circuit 310 and the voltage stress level of power stage 182 from peak voltage detection circuit 328 and, based on this information, determine a HS driver strength level for the set of HS gate drivers 320-1. HS driver strength modulator circuit 314-1 may connect a subset of the set of HS gate drivers 320-1 to the HS gate of HS switch 188 at GH and disconnect a remaining subset of the set of HS gate drivers 320-1 from the HS gate of HS switch 188 at GH based on the HS driver strength level, as described below in further detail with respect to FIG. 4.

Similarly, LS driver strength modulator circuit 314-2 may receive the load current information of power stage 182 from current sense circuit 310 and the voltage stress level of power stage 182 from peak voltage detection circuit 324 and, based on this information, determine a LS driver strength level for the set of low side gate drivers 320-2. LS driver strength modulator circuit 314-2 may provide the LS driver strength level output to the set of LS gate drivers 320-2. LS driver strength modulator circuit 314-2 may connect a subset of the set of LS gate drivers 320-2 to the LS gate of LS switch 189 at GL and disconnect a remaining is subset of the set of LS gate drivers 320-2 from the LS gate of LS switch 189 at GL based on the LS driver strength level, as described below in further detail with respect to FIG. 4.

Figure 4:
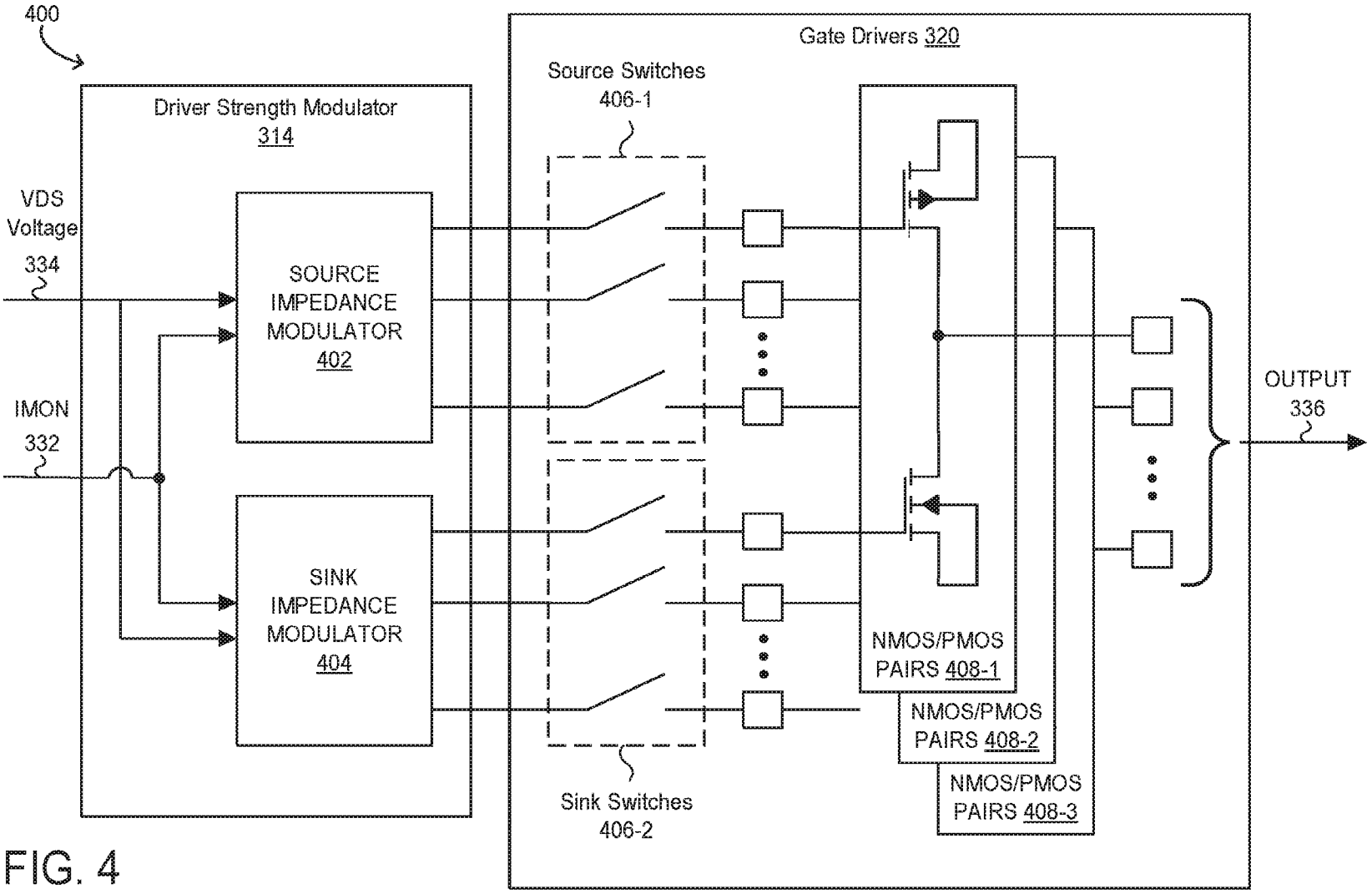
FIG. 4 is a diagram of selected elements of an embodiment of a multi-phase voltage regulator power stage with switch driver circuitry having a driver strength modulator circuit and a set of switch drivers.

Referring now to FIG. 4, selected elements of an embodiment of a multi-phase voltage regulator 400 with switch driver circuitry 184 having driver strength modulator circuit 314 and the set of gate drivers 320. FIG. 4 illustrates further internal details of driver strength modulator circuit 314 and the set of gate drivers 320. It is noted that FIG. 4 is not drawn to scale but is a schematic illustration. In various embodiments, driver strength modulator circuit 314 and the set of gate drivers 320 may be implemented using additional or fewer elements than illustrated in FIG. 4.

As shown in FIG. 4, driver strength modulator circuit 314 may include a source impedance modulator 402 and a sink impedance modulator 404 which are coupled to peak voltage detection circuit 324 and current sense circuit 310 of switch driver circuitry 184. The set of gate drivers 320 may include a set of source switches 406-1, a set of sink switches 406-2, and a set of NMOS and PMOS pairs including NMOS and PMOS pairs 408-1, 408-2, and 408-3 in parallel totem pole structures. The set of source switches 406-1 and the set of sink switches 406-2 may be coupled to the set of NMOS and PMOS pairs 408-1, 408-2, and 408-3, and the set of NMOS and PMOS pairs 408-1, 408-2, and 408-3 may be coupled to output 336 of the set of gate drivers 320.

During operation, source impedance modulator 402 of driver strength modulator circuit 314 may receive the load current information 332 including IMON and IREF of power stage 182 from current sense circuit 310 and the voltage stress level 334 including VDS voltage of power stage 182 from peak voltage detection circuit [328] *324*. Source impedance modulator 402 of driver strength modulator circuit 314 may determine a source driver strength level for the set of gate drivers 320 based on one or more of the load current information 332 and the voltage stress level 334. Source impedance modulator 402 may compare the load current, IMON, to the load current reference, IREF, and the voltage stress level, VDS voltage, to a VDS voltage reference as part of the source driver strength level determination. In response to the determination of the source driver strength level, source impedance modulator 402 of driver strength modulator circuit 314 may connect a subset of the set of NMOS and PMOS pairs 408-1, 408-2, and 408-3 to output 336 of the set of gate drivers 320 by closing the corresponding subset of the set of source switches 406 and disconnect a remaining subset of the set of NMOS and PMOS pairs 408-1, 408-2, and 408-3 from output 336 of the set of gate drivers 320 by opening the corresponding remaining subset of the set of source switches 406 based on the source driver strength level, where output 336 is coupled to the gate of power switch 186. The number of source switches that are closed may be proportional to the source driver strength level and inversely proportional to the impedance. For example, the more source switches 406 that are closed, the higher the source driver strength level becomes and the lower the impedance level. Similarly, the more source switches that are opened, the lower the source driver strength level becomes and the higher the impedance level.

Similarly, sink impedance modulator 404 of driver strength modulator circuit 314 may receive the load current information 332 including IMON and IREF of power stage 182 from current sense circuit 310 and the voltage stress level 334 including VDS voltage of power stage 182 from it peak voltage detection circuit [328] *324*. Sink impedance modulator 404 of driver strength modulator circuit 314 may determine a sink driver strength level for the set of gate drivers 320 based on one or more of the load current information 332 and the voltage stress level 334. In response is to the determination of the sink driver strength level, sink impedance modulator 404 of driver strength modulator circuit 314 may connect a subset of the set of NMOS and PMOS pairs 408-1, 408-2, and 408-3 to output 336 of the set of gate drivers 320 by closing the corresponding subset of zo the set of sink switches 408 and disconnect a remaining subset of the set of NMOS and PMOS pairs 408-1, 408-2, and 408-3 from output 336 of the set of gate drivers 320 by opening the corresponding remaining subset of the set of sink switches 408 based on the determined sink driver strength level, where output 336 is coupled to the gate of power switch 186. As discussed above with respect to the source switches, the more sink switches 406 that are closed, the higher the sink driver strength level becomes and the lower the impedance level. Similarly, the more sink switches that are opened, the lower the sink driver strength level becomes and the higher the impedance level. Source impedance modulator 402 and sink impedance module 404 of driver strength modulator 314 allow the set of source switches 406 and the set of sink switches to be controlled independent of each other. Depending on the load conditions, the source driver strength level and the sink driver strength level may not need to be at the same driver strength levels.

In one or more embodiments, source impedance modulator 402 and sink impedance modulator 404 of driver strength modulator circuit 314 may use a threshold based logic table to determine the source and sink driver strength levels respectively. In one or more embodiments, driver strength modulator circuit 314 may be high side driver strength modulator circuit 314-1 having high side source impedance modulator 402-1 and sink impedance modulator 404-1 and source and sink driver strength levels correspond to high side source and high side sink driver strength levels. In one or more other embodiments, driver strength modulator circuit 314 may be low side driver strength modulator circuit 314-2 having low side source impedance modulator 402-2 and sink impedance modulator 404-2 and source and sink driver strength levels correspond to low side source and low side sink driver strength levels. An example of a threshold based logic table for determining HS and LS driver strength levels based on load current information are given in table I below.

TABLE I

Driver Strength versus IMON

| | IMON | Driver Strength |
|---|---|---|
| HS | High Positive | Low Strength |
| | Medium Positive | Medium Strength |
| | Low Positive | High Strength |
| | Negative | High Strength |
| LS | High Negative | Low Strength |
| | Medium Negative | Medium Strength |
| | Low Negative | High Strength |
| | Positive | High Strength |

As shown in table I, when the load current is higher, the driver strength used should be lower and when the load current is lower, the driver strength used should be higher. For example, a high driver strength should be used for the set of high side gate drivers 320-1 when the load current of power switch 186 has a low positive value. In another example, a low driver strength should be used for the set of low side gate drivers 320-2 when the load current of power switch 186 has a high negative value.

The driver strength characteristics are governed by the soft and hard switching of power switch 186 and the voltage stress level 334 (VDS voltage) and the load current information 332 (IMON) positive correlation. To turn ON power switch 186, one of the set of gate drivers 320 needs to source the energy from VCC by turning ON the corresponding PMOS of the NMOS and PMOS pair 310. The driver strength of source capability can be modulated by paralleling additional PMOSs of the NMOS and PMOS pairs 310 based on the voltage stress level 334 (VDS voltage) and the load current information 332 (IMON), which correspond to the subset of the set of NMOS and PMOS pairs 408 connected to output 336 of the set of gate drivers 320.

To turn OFF power switch 186, one of the set of gate drivers 320 needs to sink the energy from the gate of power switch 186 by turning ON the corresponding NMOS of the NMOS and PMOS pair 408. The driver strength of sink capability can be modulated by paralleling additional NMOSs of the NMOS and PMOS pairs 310 based on the voltage stress level 334 (VDS voltage) and the load current information 332 (IMON), which correspond to the subset of the set of NMOS and PMOS pairs 408 connected to output 336 of the set of gate drivers 320. In default operation, drive strength may be preset at a medium strength.

Referring back to FIG. 3, driver voltage optimizer circuit 316 may operate to control the gate driver voltage for the set of high side gate drivers 320-1 and the set of low side gate drivers 320-2 of power switch 186 for optimizing multi-stage voltage regulator 180 loss in various loading conditions. The gate driver voltage impacts the gate charge at the gate drivers 320 and the on resistance of power switch 182 as given by the following equations (1) and (2):

$$P_{gate}=P_{gate_LS}+P_{gate_HS}=(Q_{g(LS)}+Q_{g(HS)})*V_{Driver}*f_{SW} \quad (1)$$

where $P_{gate}$ is the power consumption of the gate drivers 320 of power switch 186, $P_{gate_LS}$ is the portion of power consumption of the high side gate drivers 320-1, $P_{gate_HS}$ is the portion of power consumption of the high side gate drivers 320-1, $Q_{g(HS)}$ is the gate charge at the high side gate drivers 320-1, $Q_{g(LS)}$ is the gate charge at the low side gate drivers 320-2, $V_{Driver}$ is the gate driver voltage at the gate drivers 320, and is the switching loss at the switching node output of power switch 186.

$$P_{cond}=R_{ds(ON)LS}*I^2_{RMS(LS)}+R_{ds(ON)HS}*I^2_{RMS(HS)} \quad (2)$$

where Pcond is the conduction loss at the power switch 186, Rds(ON)LS is the on resistance of the low side switch 189, Rds(ON)HS is the on resistance of the high side switch 188, $I^2_{RMS}$(LS) is the root-mean-square (RMS) value of the current flowing through the low side switch 189, and $I^2_{RMS}$ (HS) is the RMS value of the current flowing through the high side switch 188. In a light load operating condition, the switching loss in a power switch is a more dominant factor than the conduction loss in the overall multi-phase voltage regulator power loss. Gate driver loss belongs to the switching loss and can be further reduced by reducing the driver voltage in the light load condition. At the same time, the charge level of the power switch 186 will decrease as well with the decrease of the gate driver voltage. In the heavy load operation, the conduction loss is a more dominant factor than the switching loss in the overall multi-phase voltage regulator power loss. The higher gate drive voltage creates smaller on resistance of the power switch 186 and results an overall efficiency increase.

During operation, driver voltage optimizer circuit 316 may receive load current information 332 including a load current IMON and a load current reference IREF of power stage 182 from current sense circuit 310. Driver voltage optimizer circuit 316 may determine the load current level by a comparison of the load current to the load current reference. Then, driver voltage optimizer circuit 316 may adjust a driver voltage level for the set of high side gate drivers 320-1 and the set of low side gate drivers 320-2 based on the received load current level of power stage 182. When driver voltage optimizer circuit 316 determines that the load current level is less than or equal to a light load current threshold level, driver voltage optimizer circuit 316 may reduce the driver voltage level to adjust the driver voltage level for the set of high side gate drivers 320-1 and the set of low side gate drivers 320-2. When driver voltage optimizer circuit 316 determines that the load current level is greater than a heavy load condition threshold level, driver voltage optimizer circuit 316 may increase the driver voltage level to adjust the driver voltage level.

In one or more embodiments, driver voltage optimizer circuit 316 may use a threshold based logic table to determine the driver voltage level. The dynamic range of gate driver voltage levels may be controlled in a window of operation so that no other parameters, e.g. driver strength level or dead-times, are impacted. An example of a predefined threshold based logic table for determining the driver voltage level based on load current information is given in table II below. In exemplary table II, low voltage is 4.5V, nominal voltage is 5V and high voltage is 5.5V.

TABLE II

| Driver Voltage versus IMON | |
|---|---|
| IMON | Driver Voltage |
| Below the Defined Positive Load Level I | Low Voltage |
| Below the defined positive load level II | Nominal Voltage |

TABLE II-continued

| Driver Voltage versus IMON | |
|---|---|
| IMON | Driver Voltage |
| Below the Defined Positive Load Level III | High Voltage |
| Below the Defined Negative Load Level III | Low Voltage |
| Below the Defined Negative Load Level II | Nominal Voltage |
| Below the Defined Negative Load Level I | High Voltage |

As shown in table II, higher positive load current levels may correlate to higher driver voltage levels and lower positive load current levels may correlate to lower driver voltage levels. Similarly, higher magnitude negative load current levels may correlate to higher driver voltage levels and lower magnitude negative load current levels may correlate to lower driver voltage values. For example, a high gate driver voltage (5.5V) should be used when the load current is within the range of greater than or equal to the defined positive load level II and less than the defined positive load level III. In another example, a low gate driver voltage (4.5V) should be used when the load current is less than the defined negative load level III.

Driver voltage optimizer circuit 316 of power stage 182 allows individual control of the gate driver voltage of the set of gate drivers 320 of each power switch 186 of multi-phase voltage regulator 180 and only adjusts the gate driver voltage based on meeting predefined load current criteria as described above. As such, optimization for either reducing the gate driver loss or resistance on loss dynamically and autonomously occurs in each individual phase when meeting the predefined load current criteria and exits and does not occur when failing the predefined load current criteria.

In FIG. 3, dead-time management circuit 306 may control and optimize the duration of the dead-time of power stage 182 based on the temperature of power stage 182. The dead-time is the amount of time when both high side switch 188 and low side switch 189 are in the off state and may prevent large current peaks that would otherwise occur due to shorting the input (down converter) or the output (up converter). The duration of the dead-time may change based on the temperature of power stage 182 due to temperature dependency characteristics of semiconductor material, where the change in the duration of the dead-time is proportional to the change in temperature. When the operating temperature of power stage 182 increases, there is a gradual corresponding increase of the duration of the dead-time of power switch 182, which may result in additional power loss. The relationship between the operating temperature of each power stage 182 and the duration of the dead-time of each power switch 186 of power stage 182 may be determined by simulation and predefined during the design of multi-stage voltage regulator 180, which may allow dead-time management circuit 306 to safely compensate for changes in the duration of dead-time due to temperature changes by dynamic adjustments of dead-time duration.

During operation, dead-time management circuit 306 may receive temperature information including a current temperature of power stage 182 from thermal sense circuit 304. Dead-time management circuit 306 may determine whether the current temperature of power stage 182 is less than or equal to a low temperature region threshold. In response to determining that the current temperature of power stage 182 is less than or equal to the low temperature region threshold, dead-time management circuit 306 may adjust a programmable portion of a dead-time duration for the set of high side gate drivers 320-1 and the set of low side gate drivers 320-2 to a low temperature duration value. Dead-time management circuit 306 may determine whether the current temperature of power stage 182 is greater than or equal to a high temperature region threshold. In response to determining that the current temperature of power stage 182 is greater than or equal to a high temperature region threshold, dead-time management circuit 306 may adjust the programmable portion of the dead-time duration for the set of high side gate drivers 320-1 and the set of low side gate drivers 320-2 to a high temperature duration value. The dead-time duration of power switch 182 may include the programmable portion of the dead-time duration and a dynamic portion of the dead-time duration, where the dynamic portion of the dead-time duration may be proportional to a change in temperature of the power stage when the power stage may be in an operating temperature region. Power stage 182 operates across a wide range of temperatures due to the dynamic load conditions of power stage 182 and its ambient thermal environment, which may result in significant changes in the dynamic portion of the dead-time duration of power switch 186. For example, when power stage 182 is operating in a high temperature region, the dynamic dead-time duration may increase by a few extra nano-seconds. By dead-time management circuit 306 adjusting the programmable portion of the duration of dead-time based on the temperature of the power stage 182, the changes in the dynamic portion of the dead-time duration may be compensated for and may result in increased system efficiency.

Figure 5:
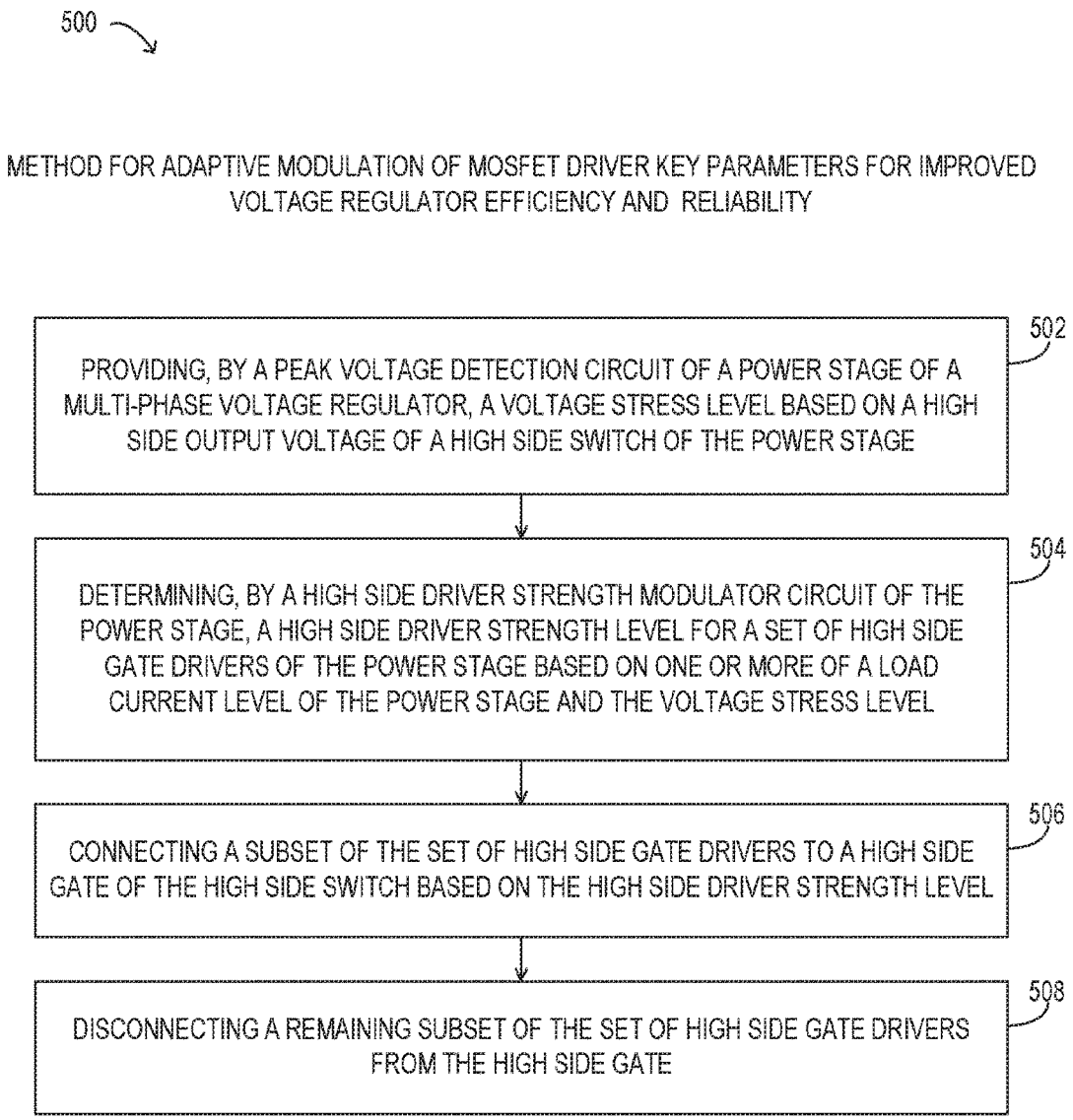
FIG. 5 is flowchart depicting selected elements of an embodiment of a method for adaptive modulation of switch driver parameters for improved voltage regulator efficiency and reliability in a multi-phase voltage regulator.

FIG. 5 is a flowchart depicting selected elements of an embodiment of a method 500 for adaptive modulation of MOSFET driver key parameters for improved voltage regulator efficiency and reliability in a multi-phase voltage regulator (such multi-phase voltage regulator 180). It is noted that certain operations described in method 500 may be optional or may be rearranged in different embodiments.

The multi-phase voltage regulator may include a voltage regulator controller and a plurality of power stages coupled to the voltage regulator controller. Each power stage of the plurality of the power stages may include a high side switch including a high side gate, a peak voltage detection circuit coupled to the high side switch, and a HS driver strength modulator circuit coupled to the peak voltage detection circuit.

Method 500 may begin at step 502, providing, by the peak voltage detection circuit of a power stage of a multi-phase voltage regulator, a voltage stress level based on a high side output voltage of the high side switch of the power stage. At step 504, determining, by the HS driver strength modulator circuit of the power stage, a HS driver strength level for a set of high side gate drivers of the power stage based on one or more of a load current level of the power stage and the voltage stress level. At step 506, connecting a subset of the set of high side gate drivers to a high side gate of the high side switch based on the HS driver strength level. At step 508, disconnecting a remaining subset of the set of high side gate drivers from the high side gate.

As disclosed herein, systems and methods for adaptive modulation of MOSFET driver key parameters for improved voltage regulator efficiency and reliability in a multi-phase voltage regulator may include a power stage. The power stage may include a high side switch including a high side gate, a peak voltage detection circuit, and a high side driver strength modulator circuit. The high side driver strength modulator circuit may determine a high side driver strength level. The high side driver strength modulator circuit may also connect a subset of the set of high side gate drivers to the high side gate based on the high side driver strength level. The high side driver strength modulator circuit may also disconnect a remaining subset of the set of high side gate drivers from the high side gate.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

[1. A voltage regulator, comprising:

a power stage including:

a high side switch including a high side gate;

a peak voltage detection circuit coupled to the high side switch to provide a voltage stress level based on a high side output voltage of the high side switch;

a high side driver strength modulator circuit coupled to the peak voltage detection circuit configured to:

determine a high side driver strength level for a set of high side gate drivers based on a load current level of the power stage and the voltage stress level;

connect a subset of the set of high side gate drivers to the high side gate based on the high side driver strength level; and disconnect a remaining subset of the set of high side gate drivers from the high side gate; and a dead-time management circuit configured to:

adjust a programmable portion of a dead-time duration for the set of high side gate drivers and a set of low side gate drivers, the dead-time duration including the programmable portion of the dead-time duration and a dynamic portion of the dead-time duration proportional to a change in temperature of the power stage when the power stage is in an operating temperature region, wherein the programmable portion of the dead-time duration is adjusted to a low temperature duration value when the dead-time management circuit determines that a current temperature of the power stage is less than or equal to a low temperature region threshold, and wherein the programmable portion of the dead-time duration is adjusted to a high temperature duration value when the dead-time management circuit determines that the current temperature of the power stage is greater than or equal to a high temperature region threshold.]

[2. The voltage regulator of claim 1, wherein higher positive load current levels correlate to higher driver voltage levels and lower positive load current levels correlate to lower driver voltage levels, and wherein higher magnitude negative load current levels correlate to higher driver voltage levels and lower magnitude negative load current levels correlate to lower driver voltage values.]

[3. The voltage regulator of claim 1, the power stage further comprising:

a low side switch including a low side gate; and a low side driver strength modulator circuit coupled to the peak voltage detection circuit configured to:

determine a low side driver strength level for the set of low side gate drivers based on the load current level of the power stage and the voltage stress level;

connect a subset of the set of low side gate drivers to the low side gate based on the low side driver strength level; and disconnect a remaining subset of the set of low side gate drivers from the low side gate.]

[4. The voltage regulator of claim 3, wherein each of the high side switch and the low side switch is a metal-oxide-semiconductor-field-effect-transistors (MOSFETs).]

[5. The voltage regulator of claim 3, further comprising:

a driver strength modulator circuit including:

a source impedance modulator circuit;

a set of high side driver switches, each coupled between a corresponding high side gate driver of the set of high side gate drivers and the high side gate, wherein the connection of the subset of the set of high side gate drivers to the high side gate further comprises:

the source impedance modulator circuit configured to close a subset of the set of high side driver switches to connect the subset of the set of high side gate drivers to the high side gate;

a sink impedance modulator circuit; and a set of low side driver switches, each coupled between a corresponding low side gate driver of the set of low side gate drivers and the low side gate, wherein the connection of the subset of the set of low side gate drivers to the low side gate further comprises:

the sink impedance modulator circuit configured to close a subset of the set of low side driver switches to connect the subset of the set of low side gate drivers to the low side gate.]

[6. The voltage regulator of claim 5, further comprising:

a driver voltage optimizer circuit configured to adjust a driver voltage level for the set of high side gate drivers and the set of low side gate drivers.]

[7. The voltage regulator of claim 6, wherein the driver voltage optimizer circuit to adjust the driver voltage level is further configured to:

reduce the driver voltage level when the driver voltage optimizer circuit determines that the load current level is less than or equal to a light load current threshold level; and increase the driver voltage level when the driver voltage optimizer circuit determines that the load current level is greater than a heavy load condition threshold level.]

[8. A method comprising:

providing, by a peak voltage detection circuit of a power stage of a voltage regulator, a voltage stress level based on a high side output voltage of a high side switch of the power stage;

determining, by a high side driver strength modulator circuit of the power stage, a high side driver strength level for a set of high side gate drivers of the power stage based on a load current level of the power stage and the voltage stress level;

connecting a subset of the set of high side gate drivers to a high side gate of the high side switch based on the high side driver strength level;

disconnecting a remaining subset of the set of high side gate drivers from the high side gate; and adjusting, by a dead-time management circuit, a programmable portion of a dead-time duration for the set of high side gate drivers and a set of low side gate drivers, wherein the dead-time duration includes the programmable portion of the dead-time duration and a dynamic portion of the dead-time duration proportional to a change in temperature of the power stage when the power stage is in an operating temperature region, and wherein adjusting the programmable portion of the dead-time duration for the set of high side gate drivers and the set of low side gate drivers comprises:

determining when a current temperature of the power stage is less than or equal to a low temperature region threshold;

in response to determining that the current temperature is less than or equal to the low temperature region threshold, adjusting the programmable portion of the dead-time duration for the set of high side gate drivers and the set of low side gate drivers to a low temperature duration value;

determining when the current temperature of the power stage is greater than or equal to a high temperature region threshold; and in response to determining that the current temperature is greater than or equal to the high temperature region threshold, adjusting the programmable portion of the dead-time duration for the set of high side gate drivers and the set of low side gate drivers to a high temperature duration value.]

[9. The method of claim 8, wherein higher positive load current levels correlate to higher driver voltage levels and lower positive load current levels correlate to lower driver voltage levels, and wherein higher magnitude negative load current levels correlate to higher driver voltage levels and lower magnitude negative load current levels correlate to lower driver voltage values.]

[10. The method of claim 8, further comprising:

determining, by a low side driver strength modulator circuit of the power stage, a low side driver strength level for the set of low side gate drivers of the power stage based on the load current level of the power stage and the voltage stress level;

connecting a subset of the set of low side gate drivers to a low side gate of a low side switch based on the low side driver strength level; and disconnecting a remaining subset of the set of low side gate drivers from the low side gate.]

[11. The method of claim 10, wherein each of the high side switch and the low side switch is a metal-oxide-semiconductor-field-effect-transistors (MOSFETs).]

[12. The method of claim 10, wherein connecting the subset of the set of high side gate drivers to the high side gate further comprises:

closing, by a source impedance modulator circuit, a subset of a set of high side driver switches of the power stage to connect the subset of the set of high side gate drivers to the high side gate; and wherein connecting the subset of the set of low side gate drivers to the low side gate further comprises:

closing, by a sink impedance modulator circuit, a subset of a set of low side driver switches to connect the subset of the set of low side gate drivers to the low side gate.]

[13. The method of claim 12, further comprising:

adjusting, by a driver voltage optimizer circuit, a driver voltage level for the set of high side gate drivers and the set of low side gate drivers.]

[14. The method of claim 13, wherein adjusting the driver voltage level further comprises:

reducing the driver voltage level when the driver voltage optimizer circuit determines that the load current level is less than or equal to a light load current threshold level; and increasing the driver voltage level when the driver voltage optimizer circuit determines that the load current level is greater than a heavy load condition threshold level.]

*15. A voltage regulator, comprising:*

*a power stage including:*

*a first power switch having a high side switch including a high side gate;*

*a current sense circuit coupled to the high side switch to monitor and report a load current level of the power stage;*

*a high side driver strength modulator circuit that is coupled to the current sense circuit and that is configured to:*

*determine a high side driver strength level for a set of high side gate drivers based on the load current level of the power stage;*

*connect a subset of the set of high side gate drivers to the high side gate based on the high side driver strength level; and*

*disconnect a remaining subset of the set of high side gate drivers from the high side gate; and*

*a dead-time management circuit that is configured to:*

*adjust a dead-time duration of the set of high side gate drivers to a first dead-time duration based on a first power stage temperature; and*

*adjust the dead-time duration of the set of high side gate drivers to a second dead-time duration that is different than the first dead-time duration based on a second power stage temperature that is greater than the first power stage temperature,*

*wherein the adjusting of the dead-time duration of the set of high side gate drivers prevents the first power switch from turning on when a second power switch that is complementary to the first power switch is turned on.*

*16. A voltage regulator, comprising:*

*a power stage including:*

*a first power switch having a high side switch including a high side gate;*

*a peak voltage detection circuit coupled to the high side switch to provide a voltage stress level of a high side output voltage of the high side switch;*

*a high side driver strength modulator circuit that is coupled to the peak voltage detection circuit and that is configured to:*

*determine a high side driver strength level for a set of high side gate drivers based on the voltage stress level of the high side output voltage of the high side switch;*

*connect a subset of the set of high side gate drivers to the high side gate based on the high side driver strength level; and*

*disconnect a remaining subset of the set of high side gate drivers from the high side gate; and*

*a dead-time management circuit that is configured to:*

*adjust a dead-time duration of the set of high side gate drivers to a first dead-time duration based on a first power stage temperature; and*

*adjust the dead-time duration of the set of high side gate drivers to a second dead-time duration that is different than the first dead-time duration based on a second power stage temperature that is greater than the first power stage temperature,*

*wherein the adjusting of the dead-time duration of the set of high side gate drivers prevents the first power switch from turning on when a second power switch that is complementary to the first power switch is turned on.*

*17. A voltage regulator, comprising:*

*a first power switch;*

*a turn-on gate driver that is configured to turn on the first power switch;*

*a plurality of P-channel Metal Oxide Semiconductor (PMOS) devices coupling the turn-on gate driver to the first power switch;*

*a turn-off gate driver that is configured to turn off the first power switch;*

*a plurality of N-channel Metal Oxide Semiconductor (NMOS) devices coupling the turn-off gate driver to the first power switch;*

*a current sense device that is configured to monitor and report load current information associated with a power stage load current;*

*at least one driver strength modulator that is coupled to the current sense device, the plurality of PMOS devices, and the plurality of NMOS devices, wherein the at least one driver strength modulator is configured to turn on the first power switch by:*

*determining, based on the load current information reported by the current sense device, a turn-on driver strength level for the turn-on gate driver; and*

*connecting the turn-on gate driver to the first power switch via at least a first subset of the plurality of PMOS devices that is based on the turn-on driver strength level, and*

*wherein the at least one driver strength modulator is configured to turn off the first power switch by:*

*determining, based on the load current information reported by the current sense device, a turn-off driver strength level for the turn-off gate driver; and*

*connecting the turn-off gate driver to the first power switch via at least a first subset of the plurality of NMOS devices that is based on the turn-off driver strength level; and*

*a dead-time management device that is configured to:*

*adjust a dead-time duration of the turn-on gate driver and the turn-off gate driver to a first dead-time duration based on a first power stage temperature; and*

*adjust the dead-time duration of the turn-on gate driver and the turn-off gate driver to a second dead-time duration that is different than the first dead-time duration based on a second power stage temperature that is greater than the first power stage temperature,*

*wherein the adjusting of the dead-time duration of the turn-on gate driver and the turn-off gate driver prevents the first power switch from turning on when a second power switch that is complementary to the first power switch is turned on.*

*18. The voltage regulator of claim 17, wherein the at least one driver strength modulator is configured to determine the turn-on driver strength level for the turn-on gate driver based on the load current information reported by the current sense device by accessing a load current information/turn-on driver strength level table that associates respective turn-on driver strength levels with respective load current information, and wherein the at least one driver strength modulator is configured to determine the turn-off driver strength level for the turn-off gate driver based on the*

*load current information reported by the current sense device by accessing a load current information/turn-off driver strength level table that associates respective turn-off driver strength levels with respective load current information.*

*19. The voltage regulator of claim 17, wherein the plurality of PMOS devices include the first subset and a second subset, and wherein the at least one driver strength modulator is configured to turn on the first power switch by:*

*connecting the turn-on gate driver to the first power switch via the first subset of the plurality of PMOS devices that is based on the turn-on driver strength level; and*

*disconnecting the turn-on gate driver from the first power switch via the second subset of the plurality of PMOS devices that is based on the turn-on driver strength level.*

*20. The voltage regulator of claim 17, wherein the plurality of NMOS devices include the first subset and a second subset, and wherein the at least one driver strength modulator is configured to turn off the first power switch by:*

*connecting the turn-off gate driver to the first power switch via the first subset of the plurality of NMOS devices that is based on the turn-on driver strength level; and*

*disconnecting the turn-off gate driver from the first power switch via the second subset of the plurality of NMOS devices that is based on the turn-on driver strength level.*

*21. The voltage regulator of claim 17, wherein the plurality of PMOS device and the plurality of NMOS devices are provided by a plurality of respective PMOS device/NMOS device pairs.*

*22. A voltage regulator, comprising:*

*a first power switch;*

*a turn-on gate driver that is configured to turn on the first power switch;*

*a plurality of PMOS devices coupling the turn-on gate driver to the first power switch;*

*a turn-off gate driver that is configured to turn off the first power switch;*

*a plurality of NMOS devices coupling the turn-off gate driver to the first power switch;*

*a voltage detection device that is configured to monitor and report voltage stress information associated with a peak voltage produced by the first power switch during switching operations;*

*at least one driver strength modulator that is coupled to the voltage detection device, the plurality of PMOS devices, and the plurality of NMOS devices, wherein the at least one driver strength modulator is configured to turn on the first power switch by:*

*determining, based on the voltage stress information reported by the voltage detection device, a turn-on driver strength level for the turn-on gate driver; and*

*connecting the turn-on gate driver to the first power switch via at least a first subset of the plurality of PMOS devices that is based on the turn-on driver strength level, and*

*wherein the at least one driver strength modulator is configured to turn off the first power switch by:*

*determining, based on the voltage stress information reported by the voltage detection device, a turn-off driver strength level for the turn-off gate driver; and*

*connecting the turn-off gate driver to the first power switch via at least a first subset of the plurality of NMOS devices that is based on the turn-off driver strength level; and*

*a dead-time management device that is configured to:*

*adjust a dead-time duration of the turn-on gate driver and the turn-off gate driver to a first dead-time duration based on a first power stage temperature; and*

*adjust the dead-time duration of the turn-on gate driver and the turn-off gate driver to a second dead-time duration that is different than the first dead-time duration based on a second power stage temperature that is greater than the first power stage temperature,*

*wherein the adjusting of the dead-time duration of the turn-on gate driver and the turn-off gate driver prevents the first power switch from turning on when a second power switch that is complementary to the first power switch is turned on.*

*23. The voltage regulator of claim 22, wherein the at least one driver strength modulator is coupled to each of the plurality of PMOS devices by respective PMOS switch devices and is configured to close each respective PMOS switch device connected to that PMOS device to connect the turn-on gate driver to the first power switch via that PMOS device.*

*24. The voltage regulator of claim 22, wherein the plurality of PMOS devices include the first subset and a second subset, and wherein the at least one driver strength modulator is configured to turn on the first power switch by:*

*connecting the turn-on gate driver to the first power switch via the first subset of the plurality of PMOS devices that is based on the turn-on driver strength level; and*

*disconnecting the turn-on gate driver from the first power switch via the second subset of the plurality of PMOS devices that is based on the turn-on driver strength level.*

*25. The voltage regulator of claim 22, wherein the plurality of NMOS devices include the first subset and a second subset, and wherein the at least one driver strength modulator is configured to turn off the first power switch by:*

*connecting the turn-off gate driver to the first power switch via the first subset of the plurality of NMOS devices that is based on the turn-on driver strength level; and*

*disconnecting the turn-off gate driver from the first power switch via the second subset of the plurality of NMOS devices that is based on the turn-on driver strength level.*

*26. The voltage regulator of claim 22, wherein the plurality of PMOS device and the plurality of NMOS devices are provided by a plurality of respective PMOS device/NMOS device pairs.*

* * * * *